United States Patent
Ha et al.

(10) Patent No.: US 6,369,008 B1
(45) Date of Patent: Apr. 9, 2002

(54) CLEANING SOLUTIONS FOR REMOVING CONTAMINANTS FROM THE SURFACES OF SEMICONDUCTOR SUBSTRATES AND CLEANING METHODS USING THE SAME

(75) Inventors: Heon-jae Ha; Dae-hyuk Chung; In-seak Hwang; Yong-sun Ko, all of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/665,622

(22) Filed: Sep. 19, 2000

(30) Foreign Application Priority Data

Sep. 20, 1999 (KR) .............................. 99-40379

(51) Int. Cl.$^7$ ................................ C11D 7/10
(52) U.S. Cl. ................ 510/175; 252/79.3; 438/689; 438/756; 134/2
(58) Field of Search .................. 134/3, 1.3, 2, 902; 252/79.3, 79.4, 79.2, 79.1, 79.5; 510/175; 438/756, 753, 689, 906

(56) References Cited

U.S. PATENT DOCUMENTS 5,454,901 A    10/1995   Tsuji ........................ 156/643.1
5,560,857 A  * 10/1996   Sakon et al.
5,990,060 A  * 11/1999   Ohmi et al.
6,273,959 B1 *  8/2001   Oonishi et al.

FOREIGN PATENT DOCUMENTS

KR         97-77282        12/1997

OTHER PUBLICATIONS

Notice to Submit Response, Korean Application No. 10–1999–0040379, Aug. 30, 2001.

* cited by examiner

Primary Examiner—Mark Kopec
Assistant Examiner—Gregory E. Webb
(74) Attorney, Agent, or Firm—Myers Bigel Sibley & Sajovec

(57) ABSTRACT

Cleaning solutions for removing contaminants from semiconductor substrates are provided and include from about 0.08 to about 0.1 percent by weight of hydrogen fluoride; from about 0.5 to about 0.6 percent by weight of ammonium fluoride; from about 24.9 to about 49.7 percent by weight of hydrogen peroxide; and from about 49.6 to about 74.5 percent by weight of water.

14 Claims, 5 Drawing Sheets

CLEANING SOLUTIONS FOR REMOVING CONTAMINANTS FROM THE SURFACES OF SEMICONDUCTOR SUBSTRATES AND CLEANING METHODS USING THE SAME

FIELD AND BACKGROUND OF THE INVENTION

The present invention relates to a cleaning solution for removing contaminants from a semiconductor substrate and cleaning method using the same.

As semiconductor devices become more highly integrated, a reduction in their elements is most likely inevitable. However, in all likelihood, not all dimensions will be reduced by the same ratio. For instance, the thickness of an interdielectric layer and wiring film is constrained by potential changes in the entire design since the interdielectric layer and wiring film should maintain minimum pressure resistance, parasitic capacitance, current capacitance, or interconnection resistance. Accordingly, an increase in the aspect ratio of a contact hole formed within an interdielectric layer often results.

The above problem in turn may require one to employ an etching process having a high selectivity ratio. Such an etching process often is problematic in that it may produce an excess of etching byproduct such as, for example, polymers. The layer exposed to such etching is often eroded. For example, in a memory cell area of a dynamic random access memory (DRAM), the process of forming a self-aligned contact (SAC) between gate electrodes often involves a high selectivity ratio between a nitride spacer along the side wall of a gate electrode and an interdielectric layer. The SAC etching process is not only capable of generating a large quantity of polymers, but also often damages the surface of a silicon substrate.

In view of the above, the process for forming the SAC is typically followed by a cleaning process for removing the etching byproduct and damaged film resulting therefrom. In on example, an SAC cleaning includes the use of standard cleaning solution 1 (SC1) which contains ammonium hydroxide, hydrogen peroxide, and water in a respective ratio of 1:4:20 by volume, followed by deionized water diluted hydrogen fluoride solution rinse. However, this conventional cleaning solution often has an undesirably high etching rate for an impurity doped interdielectric layer such as a borophosphorous silicate glass (BPSG) layer. As a result, the BPSG layer is usually also etched away in the cleaning process for removing polymer and damaged layers. Such a drawback makes adjustment of the critical dimensions of the SAC difficult, and, more significantly, it may cause an undesirable electrical short between adjacent SACs.

SUMMARY OF THE INVENTION

In an attempt to solve the above problems, it is an objective of the present invention to provide cleaning solutions for selectively removing contaminants from semiconductor substrates with respect to impurity doped dielectric layers.

It is another objective of the present invention to provide cleaning methods for removing contaminants from the surfaces of semiconductor substrates using the above cleaning solutions.

According to one aspect of the invention, a cleaning solution for removing at least one contaminant from a semiconductor substrate is provided. The cleaning solution comprises from about 0.08 to about 0.1 percent by weight of hydrogen fluoride; from about 0.5 to about 0.6 percent by weight of ammonium fluoride; from about 24.9 to about 49.7 percent by weight of hydrogen peroxide; and from about 49.6 to about 74.5 percent by weight of water.

According to another aspect of the invention, a method for removing at least one contaminant from a semiconductor substrate and comprises contacting the exposed surface of the semiconductor substrate with a cleaning solution comprising from about 0.08 to about 0.1 percent by weight of hydrogen fluoride; from about 0.5 to about 0.6 percent by weight of ammonium fluoride; from about 24.9 to about 49.7 percent by weight of hydrogen peroxide; and from about 49.6 to about 74.5 percent by weight of water to remove the at least one contaminant from the exposed surface of the semiconductor substrate.

BRIEF DESCRIPTION OF THE DRAWINGS

6D is a top view of a contact hole formed by applying a conventional cleaning solution.

DETAILED DESCRIPTION OF THE INVENTION

Figure 1:
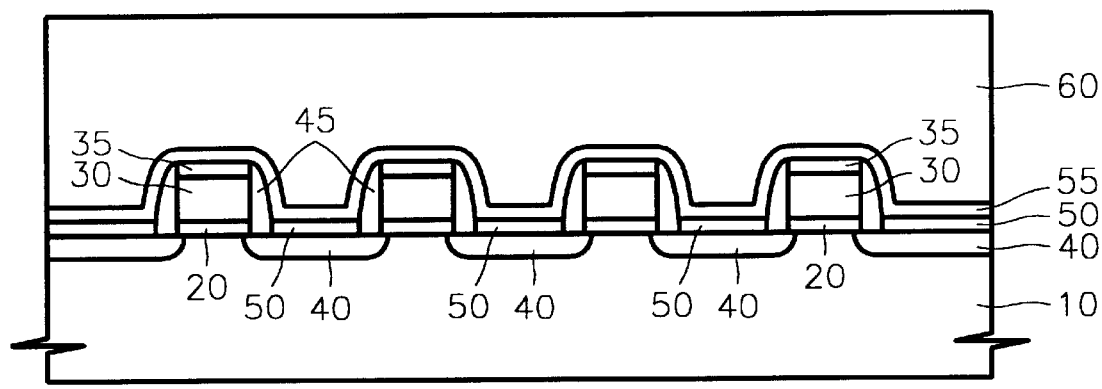
FIGS. 1 and 2 are cross sectional views showing a process for forming a self-aligned contact hole.

The present invention will now be described more fully with reference to the accompanying drawings and detailed specification, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The dimensions of the layers are exaggerated for clarity. Like numbers refer to like elements throughout.

In one aspect, the invention provides cleaning solutions for removing contaminants from semiconductor substrates. The cleaning solutions comprise hydrogen fluoride, ammonium fluoride, hydrogen peroxide, and water and are capable of selectively removing contaminants present on the surface of semiconductor substrates. Preferably, the cleaning solutions comprise from about 0.08 to about 0.1 percent by weight of hydrogen fluoride; from about 0.5 to about 0.6 percent by weight of ammonium fluoride; from about 24.9 to about 49.7 percent by weight of hydrogen peroxide; and from about 49.6 to about 74.5 percent by weight of water.

The contaminants removed by the cleaning solutions according to the present invention are typically created during the processes of forming openings within impurity doped interdielectric layers overlying the semiconductor substrates, although other contaminants can be removed. Examples of contaminants include, without limitation, dry etching by-products such as, for example, polymers, silicon oxide layers, or damaged silicon layer (e.g., created in the course of forming the openings). In various embodiments, the cleaning solutions according to the present invention are capable of selectively removing the contaminants with respect to the impurity doped interdielectric layers. Typically, the formation of openings referred to above exposes impurity regions or conductive patterns underlying the dielectric layers.

In a number of embodiments, the impurity doped dielectric layers may encompass a number of materials such as, phosphorous-containing silicate glass (e.g., borophosphorous silicate glass (BPSG)).

In another aspect, the invention provides methods for removing contaminants from semiconductor substrates. The method comprises contacting exposed surfaces of semiconductor substrates with cleaning solutions comprising from about 0.08 to about 0.1 percent by weight of hydrogen fluoride; from about 0.5 to about 0.6 percent by weight of ammonium fluoride; from about 24.9 to about 49.7 percent by weight of hydrogen peroxide; and from about 49.6 to about 74.5 percent by weight of water to remove the contaminants from the exposed surfaces of the semiconductor substrates.

The methods may also encompass other steps. In one embodiment, prior to contacting the substrates with the cleaning solutions, the methods further comprise the step of forming impurity doped dielectric layers on the semiconductor substrates and forming openings within the impurity doped dielectric layers.

In another embodiment, the methods further comprise the step of forming impurity regions within the semiconductor substrates or conductive patterns on the semiconductor substrates, prior to the step of forming the dielectric layers.

In general, the cleaning solutions according to the present invention comprising of hydrogen fluoride, ammonium fluoride, hydrogen peroxide, and water are capable of selectively removing contaminants present at the surface of a semiconductor substrate.

Not intending to be bound by theory, it is believed that the content range of the respective components of the cleaning solutions of the invention minimizes damage to impurity doped dielectric layers while selectively removing contaminants from semiconductor substrates. The contaminants in the present invention refer to dry etching byproducts such as, without limitation, polymers, a silicon oxide films, and silicon layers damaged during dry etching processes. Thus, cleaning solutions according to the present invention are suitable for processes for forming openings within impurity doped dielectric layers, and particularly for processes for forming openings which exposes impurity regions such as source/drain regions or conductive patterns, for example, polysilicon pad patterns.

The present invention will now be described in greater detail with respect to the drawings. It should be appreciated that the drawings are for the purposes of illustration and do not limit the scope of the invention as defined by the claims.

Referring to FIG. 1, a gate oxide layer 20, a gate electrode 30, and a silicon nitride capping layer 35 are sequentially formed over a semiconductor substrate 10. Next, impurities are implanted to form source/drain regions 40. A silicon nitride spacer 45 is formed along the sidewalls of the gate electrode 30, and a pad oxide layer 50 is deposited on the exposed substrate surface. Then, an impurity stopping layer 55 comprising of a silicon nitride is formed over the entire surface of the resultant, on top of which an impurity doped interdielectric layer 60 is formed.

Preferably, the impurities with which the interdielectric layer is doped are P type impurities, and therefore, the interdielectric layer can be phosphorous silicate glass (PSG) or BPSG. The impurity stopping layer 55 serves to prevent impurities with which the interdielectric layer 60 is doped from spreading into the source/drain regions 40.

Figure 2:
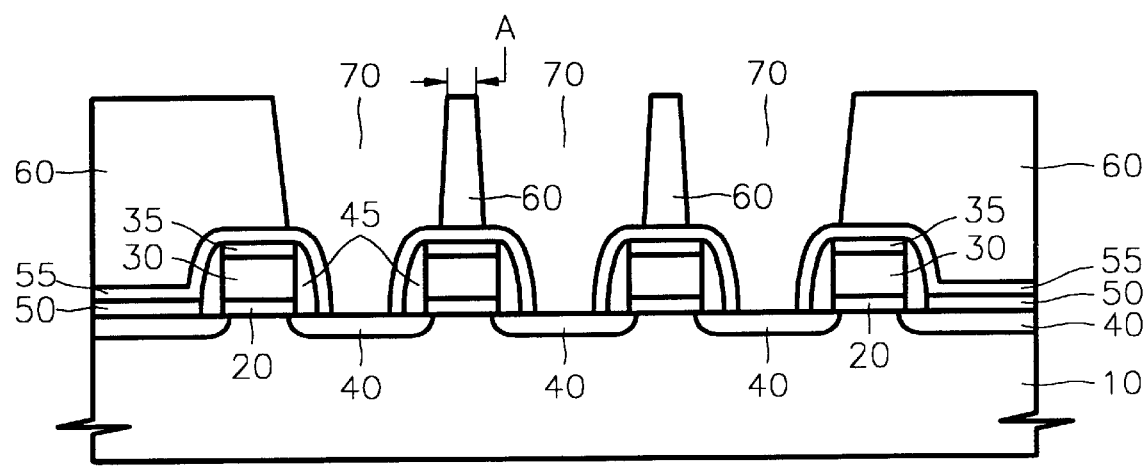

Referring to FIG. 2, a photoresist pattern (not shown) defines an opening and is deposited on the interdielectric layer 60 to act as an etching mask. Thereafter, the interdielectric layer 60 is etched by a self-aligned process, employing a selectivity ratio between the interdielectric layer 60, and the silicon nitride capping layer 35 and the spacer 45. Subsequently, the impurity stopping layer 55 and the pad oxide layer 50 are sequentially etched to form a self-aligned contact (SAC) 70.

After forming the SAC 70, impurities (for example, P-type impurities) are implanted to adjust the changed impurity concentration of the source/drain regions 40 throughout the etching process. Next, a cleaning process is carried out in order to remove polymer residues within the SAC 70 region. Polymer residues include residues on the surface of the source/drain regions 40, such as an oxide layer and/or a damaged silicon layer. This cleaning process is conducted prior to forming a pad polysilicon layer in the SAC 70.

Figure 3A:
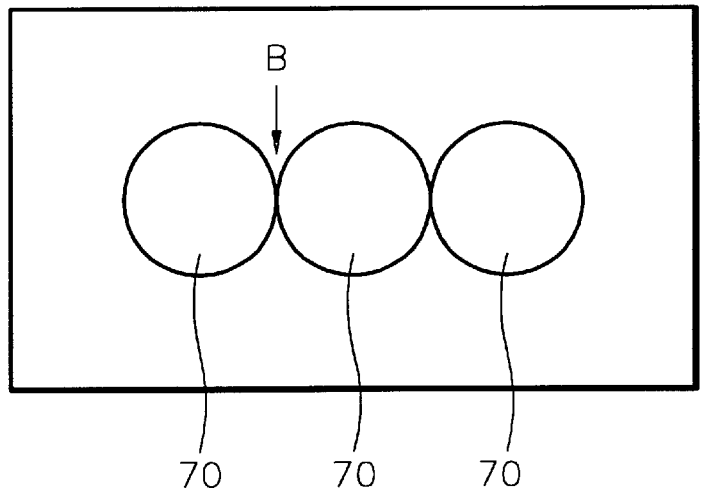
FIG. 3A is a top view of contact holes which are cleaned with a conventional cleaning solution.

As shown in FIG. 2, as a semiconductor device becomes more highly-integrated, the distance between the SACs 70 reduces. Therefore, if the interdielectric layer 60 which separates the adjacent SACs 70 is damaged during a cleaning process, the gap between the SACs 70 may be minimized. Thus, an electrical short B may result therebetween as indicated in FIG. 3A. The electrical short occasionally occurs when a cleaning process utilizes a conventional cleaning solution such as standard solution 1 (SC 1) and diluted hydrogen fluoride solution, in sequence.

Figure 3B:
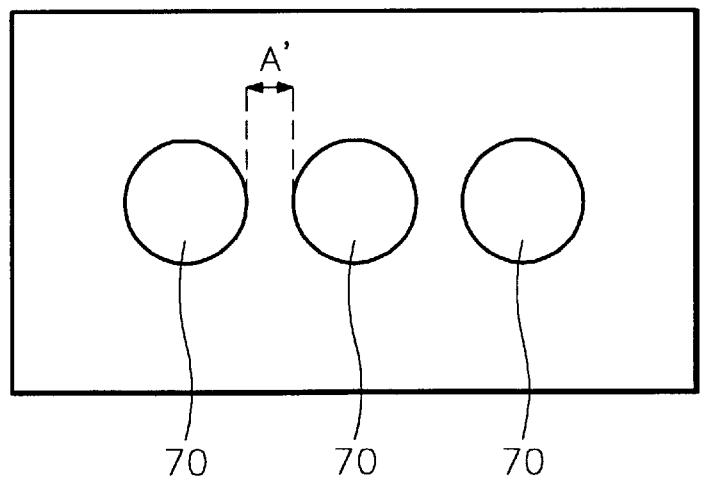
FIG. 3B is a top view of contact holes which are cleaned with a cleaning solution according to the present invention after forming self-aligned contact holes.

Conversely, a cleaning solution according to the present invention can selectively remove etching byproduct and the damaged silicon substrate surface remaining in the source/drain regions 40 while minimizing damage to the interdielectric layer 60, so that a predetermined distance A' between the SACs 70 can be maintained as shown in FIG. 3B. Not intending to be bound by theory, a cleaning mechanism for the cleaning solution according to the present invention can be classified primarily into two submechanisms: one for removing polymer and damaged film and the other for preventing damage to the impurity doped interdielectric layer 60. The first mechanism may be illustrated as follows:

$$H_2O_2 \rightarrow 2H^+ + O_2^-$$

$$Si + O_2^- \rightarrow SiO_2$$

$$2HF \rightarrow HF_2^- + H^+$$

$$SiO_2 + 2HF_2^- + H^+ \rightarrow SiF_4 + 4H_2O$$

Again, not intending to be bound by theory, it is believed that when $O_2^-$ released from the hydrogen peroxide oxidizes, the surface area of the damaged silicon substrate 10, generated from hydrogen fluoride etches the oxidized silicon surface to remove the damaged silicon layer together with a native oxide layer. Furthermore, polymer is removed by an enhanced reduction provided by $F^-$ generated from HF. Moreover, polymer residue may also be removed formed during an etching process of the damaged silicon layer.

Conversely, the mechanism for preventing damage of the impurity doped interdielectric layer 60 involves combining $NH^{4+}$ from the ammonium fluoride with the $P^-$ charged portion of the surface of the interdielectric layer 60 to thereby prevent $HF_2^-$ from reacting with the impurity doped interdielectric layer 60.

The present invention will be further described by way of illustration using the following examples which are not intended to limit the invention.

EXAMPLE 1

X-ray Photoelectron Spectroscopy (XPS)-Based Surface Analysis

In order to examine the potential capability of the cleaning solution according to the present invention, a pad oxide layer having a thickness of 110 Å and a silicon nitride layer having a thickness of 100 Å were formed over three silicon substrates, respectively, followed by a dry etching process for removing the silicon nitride and pad oxide layers. Only the pad oxide layer and the silicon nitride layer for impurity stopping (55 of FIG. 2), excluding BSPG layer, were provided over the substrates. This is carried out in consideration that generally in an SAC process, a significant amount of polymer is created during the course of etching a silicon nitride layer for impurity stopping. This example is carried out to compare the relative cleaning power of the invention.

Figure 4:
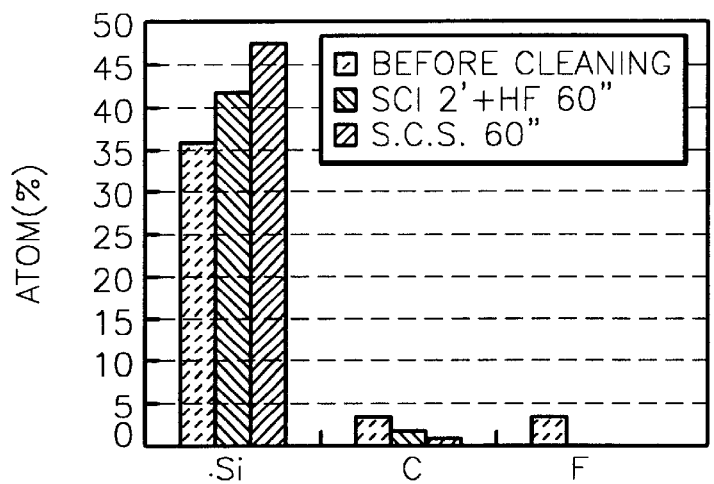
FIG. 4 is a graph showing the results of analyzing a wafer surface before cleaning and after cleaning with a conventional cleaning solution and a cleaning solution according to the present invention, based on X-ray photoelectron spectroscopy (XPS)

Of the three substrates on which the dry etching process was carried out, one was not cleaned, another was cleaned by sequentially dipping it into SC 1 (a conventional cleaning solution) for 2 minutes and a diluted hydrogen fluoride solution for 60 seconds, and the third one was cleaned by dipping it into a selective cleaning solution (S.C.S.) according to the present invention for 60 seconds. Thereafter, XPS analysis was performed on each of the above three substrates, and the results thereof are shown in FIG. 4. It can be seen from the results of FIG. 4 that the substrate cleaned by S.C.S. according to the present invention contained more silicon components and removed a lot of carbon linking polymers. Accordingly, it was found that S.C.S. according to the present invention showed a sufficient cleaning power with just 60 seconds processing.

EXAMPLE 2

Measurement of Etch Rate for BPSG Layer

In order to investigate to what extent a cleaning solution according to the present invention can minimize the etch damage of an impurity doped interdielectric layer, the following experiment was conducted. At the outset, BPSG layers having a thickness of 8500 Å were deposited on twelve substrates, followed by annealing. A native oxide layer resulting from the annealing was removed by processing for 1 minute with a buffered oxide etching solution which was a mixture of hydrogen fluoride and ammonium fluoride. Subsequently, a cleaning process was conducted on six of the processed twelve substrates. Specifically, the five substrates which acted as an experimental group were submerged in a selective cleaning solution (S.C.S.) for 60, 70, 80, 90, and 100 seconds, respectively and the remaining one acting as a control group was soaked in SC 1 for 2 minutes and diluted hydrogen fluoride solution for 60 seconds. Then, the respective etch rates (Å/min) for the BPSG layers were measured as set forth in the following Table 1.

TABLE 1

|  | Processing time | Etch rate (Å/min) |
|---|---|---|
| Experimental group |  |  |
| 1 | 60 secs. | 92 |
| 2 | 70 secs. | 101 |
| 3 | 80 secs. | 110 |
| 4 | 90 secs. | 129 |
| 5 | 100 secs. | 142 |
| Control group 1 |  | 182 |

With respect to the other six substratess, N-type impurities were implanted twice at a dose of $2 \times 10^{13}/cm^2$ with 60 KeV and then with 30 KeV, followed by implantation of P-type impurities. Then, among the six substrates, five substrates acting as an experimental group were submerged in a selective cleaning solution (S.C.S.) for 60, 70, 80, 90, and 100 seconds, respectively, and the remaining one acting as a control group was soaked in SC 1 to 2 minutes and a diluted hydrogen fluoride solution for 60 seconds. Subsequently, the respective etch rates (Å/min) for BPSG layers were measured as set forth in Table 2. In this example, the P-type impurity implantation was conducted, considering that the impurity implantation process which was performed after forming SAC in order to adjust the impurity concentration of source/drain regions prior to cleaning.

TABLE 2

|  | Processing time | Etch rate (Å/min) |
|---|---|---|
| Experimental group |  |  |
| 1' | 60 secs. | 137 |
| 2' | 70 secs. | 200 |
| 3' | 80 secs. | 233 |
| 4' | 90 secs. | 265 |
| 5' | 100 secs. | 302 |
| Control group 1' |  | 390 |

Figure 5:
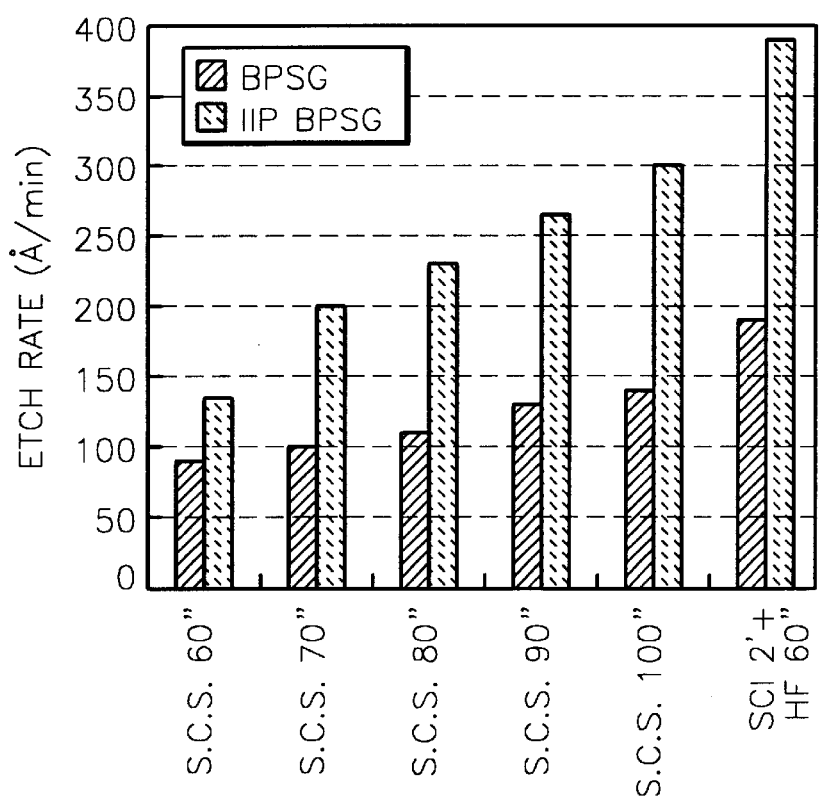
FIG. 5 is a graph showing the results of measuring the etch rate of borophosphorous silicate glass (BPSG) by a cleaning solution according to the present invention and a conventional cleaning solution.

FIG. 5 is a bar graph illustrating the results of the measured etch rates. The experimental groups 1 and 1' exhibited improved cleaning relative to control groups 1 and 1' using the conventional cleaning solution. It was found that the etch rate for BPSG layers of S.C.S. according to the present invention was only in the range of about one third to one half of that of the conventional cleaning solution. Further, S.C.S. displayed an etch rate lower than the conventional cleaning solution even when the processing time of S.C.S. was extended to 100 secs. Thus, a sufficient cleaning power is demonstrated. Accordingly, it is preferable that S.C.S. according to the present invention is used for a period of time ranging from 60 to 100 secs.

EXAMPLE 3

Measurement of Gap between SACs

After a plurality of gate electrode patterns were formed on each of four silicon substrates by employing a conventional process, a silicon nitride spacer was formed along the sidewalls of the gate electrode patterns. Further, after a pad oxide layer having a thickness of 110 Å was formed on the exposed substrate, a silicon nitride impurity stopping layer having a thickness of 100 Å and BPSG layer having a thickness of 8,500 Å were sequentially formed over the entire surface of the resultants. Next, an SAC process was performed to form a plurality of SACs having a width of 230 nm and the gap therebetween of 100 nm. Subsequently, as set forth in Table 3, the three substrates acting as an experimental group were submerged in a selective cleaning solution (S.C.S.) for 60, 90, and 120 seconds, respectively, and the remaining one acting as a control group was soaked in SC 1 for 2 minutes and a diluted hydrogen fluoride solution for 60 seconds. Thus, fabrication of SACs was completed. The results of measuring the top views of the completed SACs are shown in FIGS. 6A through 6D.

TABLE 3

| | Processing time | Gap between SACs (nm) |
|---|---|---|
| Experimental group | | |
| 1 | 60 secs | 60 |
| 2 | 90 secs | 40 |
| 3 | 120 secs | 20 |
| Control group | | Occurrence of short |

Figure 6A:
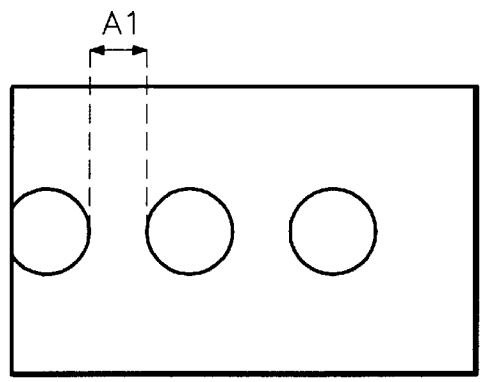
FIGS. 6A through 6C are top views of contact holes formed by applying cleaning solutions according to the present invention while FIG.
Figure 6B:
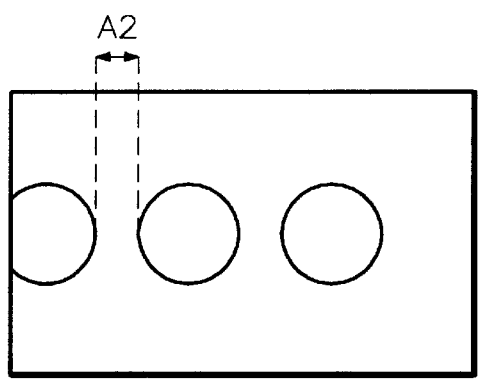
Figure 6C:
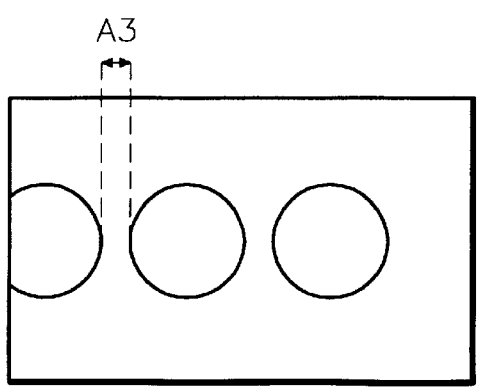
Figure 6D:
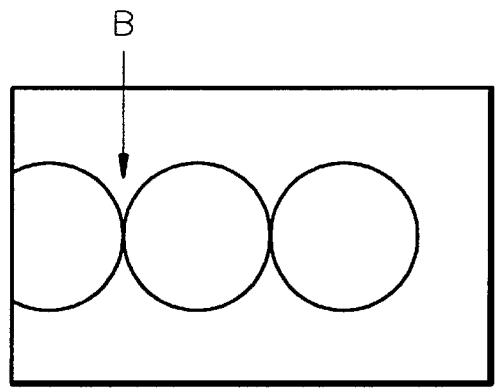

When the processing time of S.C.S. were 60, 90, and 120 secs., the gaps between SACs indicated as A1, A2, and A3 were 60, 40, and 20 nm, respectively. This suggested that a longer processing time reduced the gaps between the adjacent SACs while avoiding an electrical short between the adjacent SACs. In contrast, processing by the conventional cleaning solution resulted in the occurrence of a short between the neighboring SACs as shown in FIG. 6D.

EXAMPLE 4

Measurement of Contact Resistance

Figure 7:
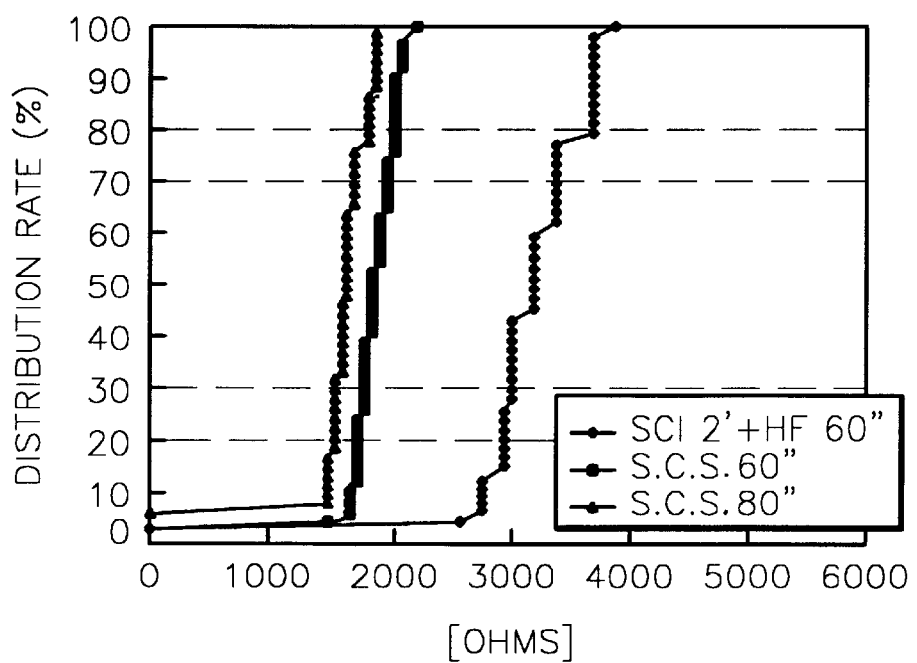
FIG. 7 is a graph showing the contact resistances when a cleaning solution according to the present invention and a conventional cleaning solution are applied.

After a plurality of SACs were formed in the same manner as Example 3, the two substrates acting as an experimental group were cleaned by S.C.S. solution according to the present invention for 60 and 80 secs., respectively, while the remaining one acting as a control group was dipped into SC 1 for 2 minutes and a diluted hydrogen fluoride solution for 60 seconds. Thus, fabrication of SACs was completed. With regard to the completed SACs, contact resistances were measured, and the results thereof are shown in FIG. 7. It can be noted from FIG. 7 that when S.C.S. according to the present invention is applied, the contact resistance is reduced by 1 even though the entire cleaning time is shorter compared to when the conventional cleaning solution is used.

Cleaning solutions according to the present invention are capable of selectively removing contaminants, for example, etching byproduct, a silicon oxide layer and a silicon layer damaged throughout a dry etching process from a semiconductor substrate, while at the same time, minimizing the etch damage to impurity doped interdielectric layers. Thus, the cleaning solutions according to the present invention are desirable for use in processes for forming openings within the impurity doped interdielectric layers.

The invention has been illustrated by the embodiments, examples, and drawings presented herein. These embodiments, examples, and drawings merely serve to illustrate the invention and do not limit the invention as defined by the claims.

What is claimed is:

1. A cleaning solution for removing at least one contaminant from a semiconductor substrate, the cleaning solution comprising:

from about 0.08 to about 0.1 percent by weight of hydrogen fluoride;

from about 0.5 to about 0.6 percent by weight of ammonium fluoride;

from about 24.9 to about 49.7 percent by weight of hydrogen peroxide; and from about 49.6 to about 74.5 percent by weight of water.

2. The cleaning solution according to claim 1, wherein the contaminants are formed and generated during a process for forming an opening within an impurity doped dielectric layer on the semiconductor substrate.

3. The cleaning solution according to claim 2, wherein the opening exposes an impurity region or a conductive pattern underlying the dielectric layer.

4. The cleaning solution according to claim 2, wherein the impurity doped dielectric layer is a phosphorous-containing silicate glass.

5. The cleaning solution according to claim 4, wherein the phosphorous-containing glass is borophosphorous silicate glass.

6. The cleaning solution according to claim 1, wherein the at least one contaminant is a dry etching byproduct.

7. The cleaning solution according to claim 6, wherein the at least one contaminant is selected from the group consisting of a polymer, a silicon oxide layer, and a damaged silicon layer created in the course of forming the opening, and wherein the cleaning solution removes the contaminants selectively with respect to the impurity doped dielectric layer.

8. A method for removing at least one contaminant from a semiconductor substrate, the method comprising:

contacting the exposed surface of the semiconductor substrate with a cleaning solution comprising from about 0.08 to about 0.1 percent by weight of hydrogen fluoride; from about 0.5 to about 0.6 percent by weight of ammonium fluoride; from about 24.9 to about 49.7 percent by weight of hydrogen peroxide; and from about 49.6 to about 74.5 percent by weight of water to remove the at least one contaminant from the exposed surface of the semiconductor substrate.

9. The method according to claim 8, wherein prior to contacting the substrate with the cleaning solution said method further comprises the steps of:

forming an impurity doped dielectric layer on the semiconductor substrate; and forming an opening within the impurity doped dielectric layer.

10. The method according to claim 8, further comprising the step of forming an impurity region within the semiconductor substrate or a conductive pattern on the semiconductor substrate, prior to the step of forming the dielectric layer.

11. The method according to claim 8, wherein the at least one contaminant is a dry etching byproduct.

12. The method according to claim 11, wherein the at least one contaminant is selected from the group consisting of a polymer, a silicon oxide layer, and a damaged silicon layer created in the course of forming the opening, and wherein the cleaning solution removes the contaminants selectively with respect to the impurity doped dielectric layer in said step of contacting the substrate with the cleaning solution.

13. The method according to claim 8, wherein the impurity doped dielectric layer comprises a phosphorous-containing silicate glass.

14. The method according to claim 13, wherein the phosphorous-containing glass is borophosphorous silicate glass.

* * * * *